(12) United States Patent
Rachmady et al.

(10) Patent No.: US 7,741,230 B2
(45) Date of Patent: Jun. 22, 2010

(54) HIGHLY-SELECTIVE METAL ETCHANTS

(75) Inventors: Willy Rachmady, Beaverton, OR (US); Jack T. Kavalieros, Portland, OR (US); Mark Y. Liu, Portland, OR (US); Mark L. Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 963 days.

(21) Appl. No.: 11/501,379

(22) Filed: Aug. 8, 2006

(65) Prior Publication Data
US 2008/0038924 A1    Feb. 14, 2008

(51) Int. Cl.
*H01L 21/302* (2006.01)

(52) U.S. Cl. ............ 438/754; 438/725; 438/745; 216/100

(58) Field of Classification Search ............ 438/745, 438/750, 752, 717, 725, 754; 216/96, 100
See application file for complete search history.

(56) References Cited

U.S. PATENT DOCUMENTS

| | | | |
|---|---|---|---|
| 5,242,543 A | | 9/1993 | Maejima et al. |
| 5,858,255 A | * | 1/1999 | Kohara et al. ............ 216/20 |
| 7,105,889 B2 | * | 9/2006 | Bojarczuk et al. ........... 257/324 |
| 2001/0005022 A1 | * | 6/2001 | Ogura ........................ 257/103 |
| 2001/0038972 A1 | * | 11/2001 | Lyons et al. ................. 430/313 |
| 2002/0022364 A1 | | 2/2002 | Hatta et al. |
| 2003/0003754 A1 | * | 1/2003 | Yokoi et al. ................. 438/704 |
| 2003/0107023 A1 | | 6/2003 | Chae et al. |
| 2005/0233527 A1 | | 10/2005 | Brask et al. |
| 2006/0058468 A1 | * | 3/2006 | Wu et al. .................... 525/386 |

FOREIGN PATENT DOCUMENTS

KR     1020050067934     7/2005

OTHER PUBLICATIONS

International Search Report and Written Opinion for PCT/US2007/074269, mailed Dec. 28, 2007, 10 pgs.
International Preliminary Report on Patentability for PCT Application No. PCT/US2007/074269 dated Feb. 19, 2009; 6 pgs.

* cited by examiner

*Primary Examiner*—Lan Vinh
(74) *Attorney, Agent, or Firm*—Blakely, Sokoloff, Taylor & Zafman LLP

(57) ABSTRACT

A highly selective metal wet etchant with an active ingredient comprising one or more types of molecules having two or more oxygen atoms is described. In one embodiment, the wet etchant is utilized to pattern a metal layer in a semiconductor structure. In another embodiment, a highly selective metal wet etchant with an active ingredient comprising one or more types of molecules having two or more oxygen atoms is used to pattern a metal gate electrode in a replacement gate processing scheme.

30 Claims, 8 Drawing Sheets

HIGHLY-SELECTIVE METAL ETCHANTS

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of metal layers, e.g. the use of metal gate electrodes. In the drive for patterning ever-smaller device features, the importance of precisely patterning such metal layers has increased dramatically.

Conventional patterning techniques used to pattern metal layers in the presence of other layers in a semiconductor structure may detrimentally impact the other layers. For example, a photo-resist may erode if present during a conventional metal patterning process. Also, the formation of residues during a metal layer patterning process may obscure the patterning process and impact the quality of the metal feature that is formed. Thus, a method to pattern metal layers in a semiconductor structure is described herein.

DETAILED DESCRIPTION

Figure 1A:
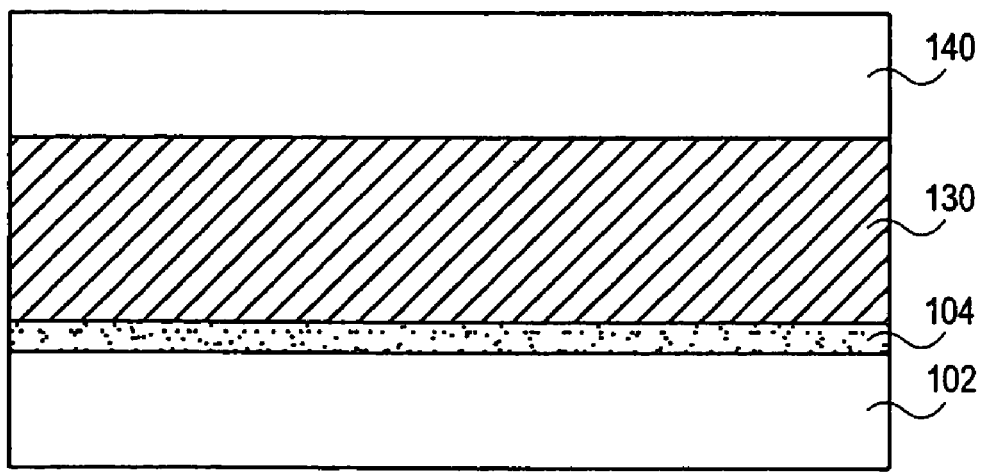
FIGS. 1A-D illustrate cross-sectional views representing the formation of a patterned metal layer in a semiconductor structure, in accordance with an embodiment of the present invention.

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a highly selective metal wet etchant with an active ingredient comprising one or more types of molecules having two or more oxygen atoms. The highly selective metal wet etchant may be utilized to pattern a metal layer in a semiconductor structure with small features. As a benefit of the high selectivity of the metal wet etchant, metal layers in direct contact with a masking layer, e.g. a photo-resist, can be patterned with high selectivity. Additionally, high-k dielectric layers present during the patterning of a metal layer using a highly selective metal wet etchant with an active ingredient comprising one or more types of molecules having two or more oxygen-atoms may become favorably passivated by super-oxide radicals generated from the active ingredient. Thus, optimization of a metal layer patterning process can be achieved.

The active ingredient in a wet etch solution dictates, for the most part (typically >95%, and often as high as 99%), the etch rate obtained when the wet etch solution is used to etch a layer or portion thereof. An active ingredient comprising one or more types of molecules having two or more neighboring (i.e. covalently bonded) oxygen atoms, e.g. $H_2O_2$, organic peroxides or ozone, may be useful for patterning a metal layer in a semiconductor device, wherein the active ingredient accounts for >95% of the actual etching of the metal layer. In accordance with one embodiment of the present invention, the active ingredient comprises one type of molecule having two oxygen atoms, such as $H_2O_2$ or an organic peroxide. In another embodiment, the active ingredient comprises one type of molecule having three oxygen atoms, such as ozone. In an embodiment, the active ingredient comprises two types of molecules having two or more oxygen atoms, such as a combination of ozone and $H_2O_2$. In a specific embodiment of the present invention, the active ingredient comprises at least one type of molecule having neighboring oxygen atoms. The active ingredient may also comprise one or more types of molecules that do not have two or more oxygen atoms. Thus, in accordance with an alternative embodiment of the present invention, the active ingredient comprises one or more types of molecules having two or more oxygen atoms in addition to one or more types of molecules that do not have two or more oxygen atoms.

As the metal species of a metal layer come into contact with the active ingredient comprising one or more types of molecules having two or more oxygen atoms, stable metal oxides may be formed and made soluble (i.e. the metal atoms of the metal layer can be non-reversibly converted to metal oxide species and trapped by the wet etchant). As such, metal atoms may be prohibited from re-forming the metal layer through re-deposition. Thus, in accordance with an embodiment of the present invention, a wet etchant with an active ingredient comprising one or more types of molecules having two or more oxygen atoms is used to efficiently and non-reversibly pattern a metal layer. The wet etchant may be used to pattern a metal layer with selectivity to other layers within the semiconductor structure. For example, in accordance with an embodiment of the present invention, the wet etchant etches a metal layer at least 10 times faster than a masking layer, i.e. the selectivity ratio is at least 10:1 for the metal layer to the masking layer.

Additionally, during the wet etch process, super-oxide radicals may be generated from the one or more types of molecules having two or more oxygen atoms. In the case where a metal layer is patterned with selectivity to a high-k dielectric layer, the presence of super-oxide radicals may enhance the selectivity. In accordance with an embodiment of the present invention, super-oxide radicals absorb onto the surface of a high-k dielectric layer and passivate the high-k dielectric layer. Thus, the wet etchant with an active ingredient comprising one or more types of molecules having two or more oxygen atoms may etch a metal layer at least 100 times faster than a high-k dielectric layer, i.e. the selectivity ratio is at least 100:1 for the metal layer to the high-k dielectric layer.

The highly selective wet etchant may be used to pattern a metal layer in a trench with very small features. As a benefit of the high selectivity to, for example, a masking layer, the highly selective wet etchant may be used to pattern a metal layer in direct contact with a masking layer and in the absence of a hard-mask. Additionally, a wet etch process may enable a much cleaner structure than a dry etch process, so residue build-up and patterning shadows may be mitigated. This wet etch process may enable the patterning of smaller features than would otherwise be accessible. Thus, in accordance with an embodiment of the present invention, a highly selective metal wet etchant with an active ingredient comprising one or more types of molecules having two or more oxygen atoms is used to pattern a metal layer in a trench with a smallest dimension (length or width) of less than 32 nanometers.

A semiconductor structure comprising a metal layer may be patterned with a highly selective metal wet etchant. FIGS. 1A-D illustrate cross-sectional views representing the formation of a patterned metal layer in a semiconductor structure, in accordance with an embodiment of the present invention. Referring to FIG. 1A, a semiconductor structure comprises a substrate 102, a dielectric layer 104, a metal layer 130 and a masking layer 140. In accordance with an embodiment of the present invention, metal layer 130 is formed directly between dielectric layer 104 and masking layer 140, as depicted in FIG. 1A.

Substrate 102 may be formed from any semiconducting material that can withstand a manufacturing process. In one embodiment, substrate 102 is comprised of a crystalline silicon, germanium or silicon/germanium layer doped with a charge carrier, such as but not limited to phosphorus, arsenic, boron, indium or a combination thereof. In another embodiment, substrate 102 is comprised of a III-V material such as but not limited to gallium nitride, gallium phosphide, gallium arsenide, indium phosphide or indium antimonide. In one embodiment, substrate 102 is comprised of an epitaxial layer grown atop a distinct crystalline substrate, e.g. a silicon epitaxial layer grown atop a boron-doped bulk silicon crystalline substrate. In accordance with another embodiment of the present invention, substrate 102 comprises an insulating layer. In one embodiment, the insulating layer is comprised of silicon dioxide, silicon nitride, silicon oxy-nitride or a high-k dielectric layer. In an embodiment, substrate 102 is comprised of an epitaxial layer and a bulk crystal substrate with an insulating layer in between the bulk crystal substrate and the epitaxial layer forming, for example, a silicon-on-insulator substrate.

Dielectric layer 104 may be formed with any material suitable to insulate a metal layer from substrate 102. In one embodiment, dielectric layer 104 is formed by a thermal oxidation process and is comprised of silicon dioxide or silicon oxy-nitride. In another embodiment, dielectric layer 104 is formed by chemical vapor deposition or atomic layer deposition and is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof.

Metal layer 130 may be formed with any conductive material with properties appropriate for the desired function of a semiconductor structure. In one embodiment, metal layer 130 is comprised of a silicide of doped polycrystalline silicon. In another embodiment, metal layer 130 is comprised of a metal layer selected from the group consisting of a metal nitride, a metal carbide, hafnium, zirconium, titanium, tantalum, aluminum, ruthenium, palladium, platinum, cobalt, nickel, a conductive metal oxide or a combination thereof. In one embodiment, metal layer 130 has a thickness in the range of 15-200 Angstroms. In an embodiment of the present invention, metal layer 130 is deposited by a physical vapor deposition, chemical vapor deposition, atomic layer deposition, electroplating deposition or an electro-less plating deposition process.

Masking layer 140 may be formed from any material suitable for undergoing a lithographic patterning process. In accordance with an embodiment of the present invention, masking layer 140 is comprised of a photo-resist in direct contact with metal layer 130. In one embodiment, the photo-resist is comprised of a material selected from the group consisting of polyhydroxy styrene resin or alicyclic polymers. In another embodiment, the photo-resist is comprised of a material selected from the group consisting of 248 nm or 193 nm photo-resists. In an alternative embodiment, masking layer 140 is also comprised of an antireflective coating, wherein the antireflective coating is comprised of a material selected from the group consisting of PGME or PGMEA. In another embodiment, masking layer 140 is also comprised of a sacrificial light-absorbing material (SLAM), such as but not limited to a spin-on glass material.

Figure 1B:
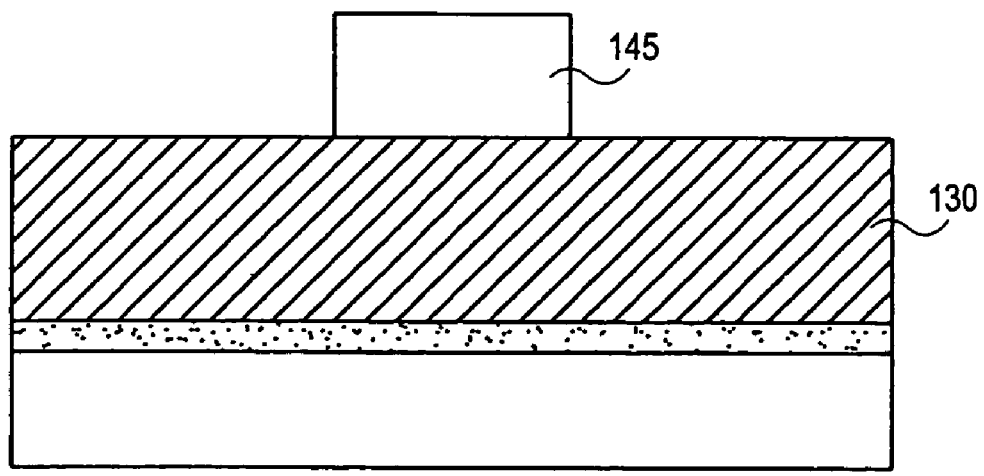

Referring to FIG. 1B, masking layer 140 may be patterned to form patterned masking layer 145 and to expose a portion of metal layer 130. Masking layer 140 may be patterned by any suitable method that provides the desired dimensions of the patterned metal layer, described below. In one embodiment, masking layer 140 is patterned with a conventional lithography process, such as 248 nm or 193 nm lithography. In another embodiment, masking layer 140 is patterned with a non-conventional lithography process, such as immersion, EUV or X-ray lithography.

Figure 1C:
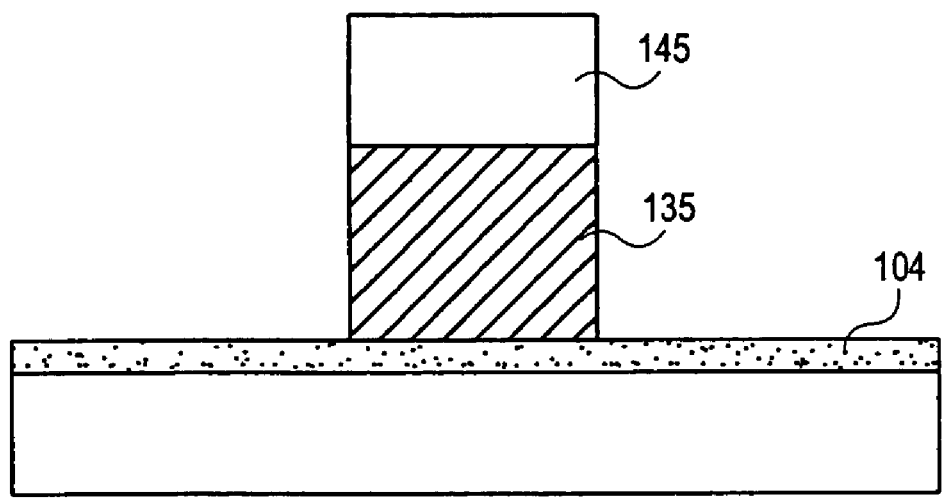

The exposed portion of metal layer 130, described in association with FIG. 1B, may be removed to form a metal feature 135, as depicted in FIG. 1C. In one embodiment, the exposed portion of metal layer 130 is removed with a wet etch solution with an active ingredient comprising one or more types of molecules having two or more oxygen atoms. In an embodiment, the active ingredient is selected from the group consisting of $H_2O_2$, an organic peroxide (e.g. diphenyl peroxide, Ph-O—O-Ph; diethyl peroxide, Et-O—O-Et; di-tert-butyl peroxide, tBu-O—O-tBu; or any other symmetric or asymmetric organic peroxide of the general formula R—O—O—R', where R and R' are alkyl or aryl groups) or a combination thereof. In another embodiment, the active ingredient is selected from the group consisting of ozone or a combination of ozone and $H_2O_2$. The ozone can be dissolved in the wet etchant to a desired concentration in the range of 0.5-5% by volume by bubbling gaseous ozone into the wet etchant media (e.g. into a mixture of water and hydrogen peroxide) at a temperature in the range of 10° C.-50° C. within about an hour prior to etching metal layer 130. Alternatively, a wet etch solution comprising ozone can be prepared in the manner described above and subsequently stored in a pressure vessel until required. In one embodiment, the wet etch solution is comprised of de-ionized water and a total concentration of the active ingredient (i.e. additive contribution of all etching molecules) in the range of 10%-20% by volume. In another embodiment, the wet etch solution has a temperature in the range of 24° C.-40° C. In one embodiment, the wet etch solution has a pH in the range of 5-8. The etch rate, i.e. the rate at which the exposed portion of metal layer 130 is removed, may be targeted to balance processing efficiency and minimization of undercut of the masking layer 140 (i.e. the undesirable removal of portions of metal layer 130 from underneath masking layer 140). In accordance with an embodiment of the present invention, the wet etch solution is comprised of de-ionized water and a concentration of the active ingredient in the range of 10%-20% by volume, has a temperature in the range of 24° C.-40° C., has a pH in the range of 5-8 and provides an etch rate in the range of 10-30 Angstroms/min. The wet etch solution may be applied to metal layer 130 in any manner suitable to bring the active ingredient of the wet etch solution in direct contact with metal layer 130. In one embodiment, the wet etch solution is applied in an immersion or spray-on process. In another embodiment, the wet etch solution is applied in a vapor chamber, wherein an aqueous form of the wet etch solution is converted to steam and then applied to metal layer 130.

Referring again to FIG. 1C, the exposed portion of metal layer 130 may be removed, as described above, with selectivity to dielectric layer 104 and with selectivity to patterned masking layer 145. In accordance with an embodiment of the present invention, dielectric layer 104 is comprised of a high-k dielectric layer and the selectivity for removing the exposed portion of metal layer 130 is at least 100:1 for metal layer 130 to dielectric layer 104. In one embodiment, the active ingredient of the wet etch solution is ozone and the ozone dissociates to provide super-oxide radicals that absorb onto the surface of dielectric layer 104. In accordance with another embodiment of the present invention, patterned masking layer 145 is comprised of a photo-resist and the selectivity for removing the exposed portion of metal layer 130 is at least 10:1 for metal layer 130 to patterned masking layer 145.

Figure 1D:
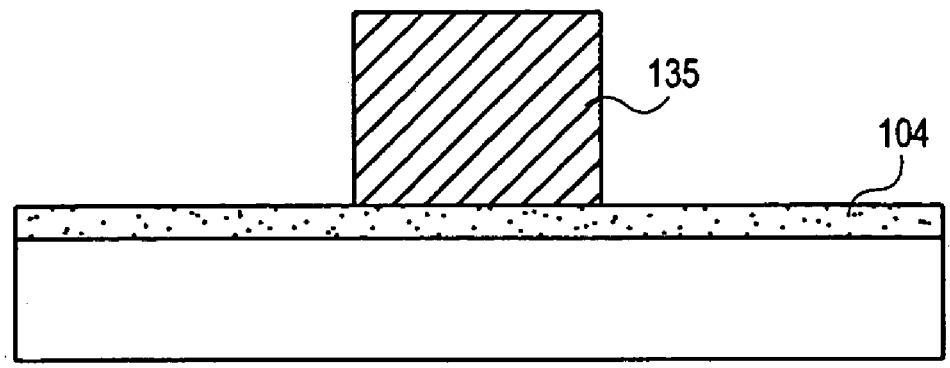

Referring to FIG. 1D, patterned masking layer 145 may be removed from metal feature 135. Patterned masking layer 145 may be removed with any technique suitable for leaving behind no residue, or a negligible amount of residue, from patterned masking layer 145 and suitable for not significantly impacting, e.g. eroding or modifying, metal feature 135 or dielectric layer 104. In one embodiment, patterned masking layer 145 is comprised of a photo-resist and is removed with an etchant selected from the group consisting of $NH_4OH$ or TMAH. In another embodiment, patterned masking layer 145 is also comprised of an antireflective coating and is removed with an etchant selected from the group consisting of TMAH, $NH_4OH$, KOH or BTMAH.

Thus, a metal layer in a semiconductor structure may be patterned with a highly selective metal wet etchant with an active ingredient comprising one or more types of molecules having two or more oxygen atoms. Such a highly selective metal wet etchant may be used to pattern metal layers for any semiconductor device. In one embodiment, the semiconductor device is a planar MOS-FET, a bipolar transistor, a memory transistor or a micro-electronic machine (MEM). In another embodiment, the semiconductor device is a non-planar device, such as a tri-gate or double-gate transistor, an independently-accessed double gated MOS-FET, or a gate-all-around MOS-FET with a nanowire channel. Specifically, the highly selective metal wet etchant can be used to pattern a metal gate electrode in a replacement gate process. As such, in accordance with an embodiment of the present invention, a highly selective metal wet etchant with an active ingredient comprising one or more types of molecules having two or more oxygen atoms is used to pattern metal layers in narrow trenches. In one embodiment, a highly selective metal wet etchant is used to pattern a metal layer in a trench with a smallest dimension (length or width) of less than 32 nanometers. As an example of one embodiment of the present invention, series of FIGS. 2-4 illustrate the use of a highly selective metal wet etchant in a replacement gate process scheme. As will be appreciated in the typical integrated circuit, both N- and P-channel transistors may be fabricated in a single substrate to form a CMOS integrated circuit.

Figure 2A:
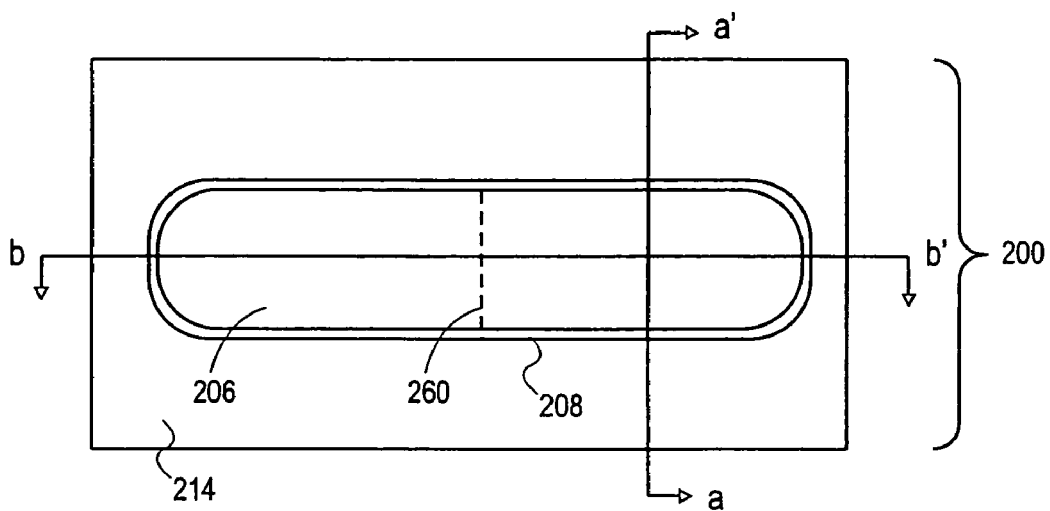
FIGS. 2A-C illustrate top-down and cross-sectional views representing a planar MOS-FET device prior to subjection to a replacement gate process, in accordance with an embodiment of the present invention.
Figure 2B:
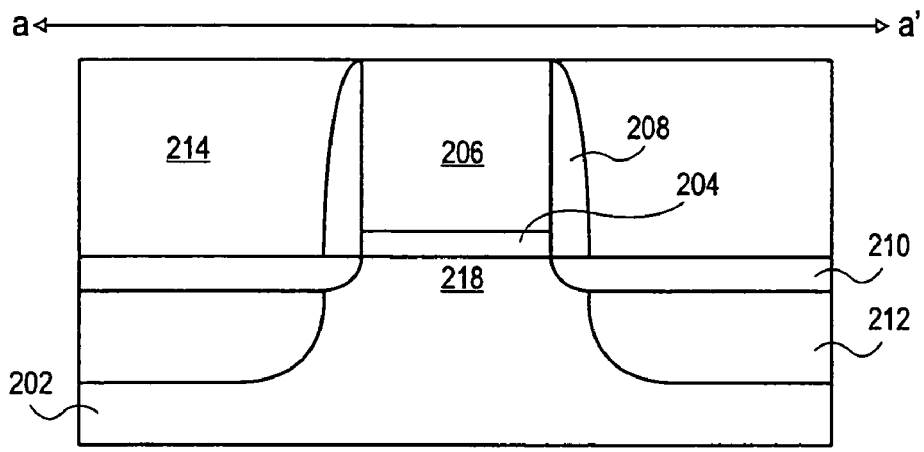
Figure 2C:
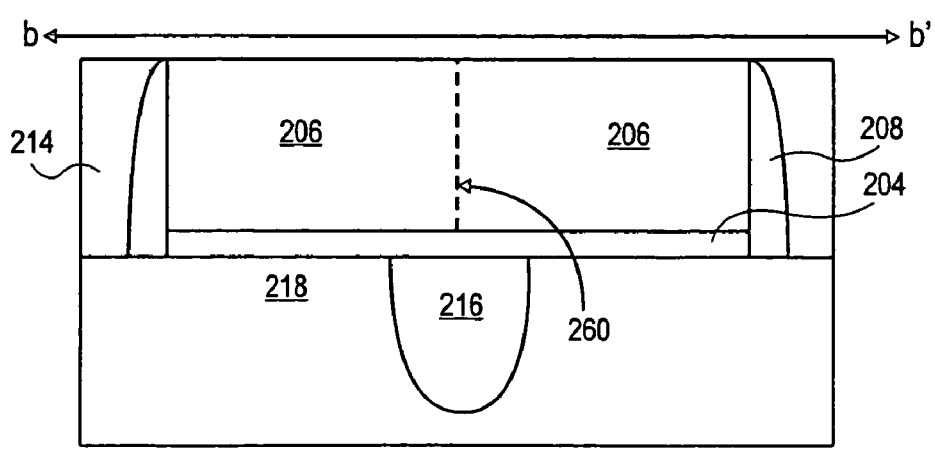

A typical replacement gate scheme utilizes a gate electrode placeholder around which the components of a semiconductor device are first formed. The gate electrode placeholder may then be removed and subsequently replaced with an actual gate electrode. FIGS. 2A-C illustrate top-down and cross-sectional views representing a planar MOS-FET device prior to subjection to a replacement gate process. Referring to FIG. 2A, a top-down view of an exposed MOS-FET 200 comprising an optional P/N junction 260 is provided. In accordance with one embodiment of the present invention, a chemical-mechanical polishing step is used to remove any layers, e.g. inter-layer dielectrics or gate electrode protection capping layer, that cover MOS-FET 200 such that the top of MOS-FET 200 is exposed, as depicted in FIG. 2A.

Referring again to FIG. 2A, a gate electrode placeholder 206 may be formed with a material suitable for removal at the replacement gate step, as discussed below. In one embodiment, gate electrode placeholder 206 is comprised of polycrystalline silicon, amorphous silicon, silicon dioxide, silicon nitride, a metal layer or a combination thereof. In an embodiment, gate electrode placeholder 206 is comprised of adjacent P-type and N-type polycrystalline silicon regions that form a P/N junction, as depicted in FIG. 2A. In another embodiment, gate electrode placeholder 206 is comprised of a sacrificial metal layer, such as titanium nitride or tantalum nitride. Gate electrode placeholder 206 may be incased in an inter-layer dielectric layer 214. Inter-layer dielectric layer 214 may be comprised of any material suitable to provide physical support and electrical isolation for gate electrode placeholder 206 and the eventual replacement gate electrode discussed below. In one embodiment, inter-layer dielectric layer 214 is comprised of silicon dioxide, a silicate or a carbon-doped oxide with 0-10% porosity.

A gate isolation 208 spacer may be formed between inter-layer dielectric layer 214 and gate electrode placeholder 206, as depicted in FIG. 2A. Gate isolation spacer 208 may be formed from any material and by any technique suitable to provide a conformal dielectric layer adjacent the sidewalls of gate electrode placeholder 206. In one embodiment, gate isolation spacer 208 is comprised of an insulating layer. In a particular embodiment, gate isolation spacer 208 is comprised of silicon dioxide, silicon oxy-nitride, carbon-doped silicon oxide, silicon nitride, carbon-doped silicon nitride or a combination thereof. In accordance with an embodiment of the present invention, gate isolation spacer 208 is formed by depositing a blanket material layer by a chemical vapor deposition process. The material layer used to form gate isolation spacer 208 may be deposited to a thickness selected to determine the final width of gate isolation spacer 208. In one embodiment, gate isolation spacer 208 has a final a thickness in the range of 50-350 Angstroms. The material layer used to form gate isolation spacer 208 may be shaped by an anisotropic etch process. In one embodiment, the final form of gate isolation spacer 208 is determined by a dry etch process, such as a remote plasma etch process or a reactive ion etch process. In another embodiment, the final form of gate isolation spacer 208 is determined by using a vertical dry or plasma etch process comprising neutral fluorocarbons and/or free radical fluorocarbons of the general formula $C_xF_y$, where x and y are natural numbers. In one embodiment, a wet chemical cleaning process step comprising the application of an aqueous solution of hydrofluoric acid, ammonium fluoride or both follows the formation of gate isolation spacer 208.

FIG. 2B represents a cross-sectional view down the a-a' projection of the structure illustrated in FIG. 2A. Gate electrode placeholder 206, gate isolation spacer 208 and inter-layer dielectric layer 214 from FIG. 2A are all depicted in FIG. 2B in their cross-sectional form. In accordance with an embodiment of the present invention, following the chemical-mechanical polishing step discussed above, the top surfaces of gate electrode placeholder 206, gate isolation spacer 208 and inter-layer dielectric layer 214 are all substantially flush with one another, as depicted in FIG. 2B.

Referring further to FIG. 2B, gate electrode placeholder 206 sits above a substrate 202. Substrate 202 may be formed from any semi-conducting material that can act as a channel region when MOS-FET 200 is in an ON state. In one embodiment, substrate 202 is comprised of a crystalline silicon, germanium or silicon/germanium layer doped with an appropriate charge carrier, such as but not limited to phosphorus, arsenic, boron, indium or a combination thereof. In another embodiment, substrate 202 is comprised of a III-V material such as but not limited to gallium nitride, gallium phosphide, gallium arsenide, indium phosphide or indium antimonide. In one embodiment, substrate 202 is comprised of an epitaxial layer grown atop a distinct crystalline substrate, e.g. a silicon epitaxial layer grown atop a boron-doped bulk silicon crystalline substrate. In accordance with another embodiment of the present invention, substrate 202 comprises an insulating layer. In one embodiment, the insulating layer is comprised of silicon dioxide, silicon nitride, silicon oxy-nitride or a high-k dielectric layer. In an embodiment, substrate 202 is comprised of an epitaxial layer and a bulk crystal substrate with an insulating layer between the bulk crystal substrate and the epitaxial layer forming, for example, a silicon-on-insulator substrate.

A gate dielectric layer 204 is formed in between gate electrode placeholder 206 and substrate 202, as depicted in FIG. 2B. Gate dielectric layer 204 may be formed with any material suitable to insulate a gate electrode from substrate 202. In one embodiment, gate dielectric layer 204 is formed by a thermal oxidation process or a PE-CVD process and is comprised of silicon dioxide or silicon oxy-nitride. In another embodiment, gate dielectric layer 204 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide. In one embodiment, gate dielectric layer 204 is the final gate dielectric layer, i.e. it is not subsequently replaced.

Referring again to FIG. 2B, tip extensions 210 may be formed by implanting charge carrier dopant impurity atoms into substrate 202. In accordance with an embodiment of the present invention, gate electrode placeholder 206 acts to mask a portion of substrate 202, forming self-aligned tip extensions 210. By self-aligning tip extensions 210 with gate electrode placeholder 206, channel region 218 may be formed in the region of substrate 202 that is underneath gate electrode placeholder 206 and gate dielectric layer 204, as depicted in FIG. 2B. In one embodiment, boron, arsenic, phosphorus, indium or a combination thereof is implanted into substrate 202 to form tip extensions 210. In another embodiment, the charge carrier dopant impurity atoms implanted to form tip extensions 210 are of opposite conductivity to channel region 218. In accordance with one embodiment of the present invention, substrate 202 is comprised of a III-V material and the charge carrier dopant impurity atoms implanted to form tip extensions 210 are selected from the group consisting of carbon, silicon, germanium, oxygen, sulfur, selenium or tellurium.

Source/drain regions 212 may also be formed by implanting charge carrier dopant impurity atoms into substrate 202. In accordance with an embodiment of the present invention, gate isolation spacers 208 and gate electrode placeholder 206 act to mask a portion of substrate 202, forming self-aligned source/drain regions 212. In effect, the width gate isolation spacers 208 may play a role in determining the dimensions and location of source/drain regions 212. As will be apparent to one skilled in the art, both N-type and P-type source/drain regions may be formed. In accordance with an embodiment of the present invention, N-type and P-type source/drain regions are formed in a device with a shared gate electrode (e.g. an SRAM device) forming P/N junction 260, as depicted in FIG. 2A. In one embodiment, boron, arsenic, phosphorus, indium or a combination thereof is implanted into a group IV substrate 202 to form source/drain regions 212. In accordance with one embodiment of the present invention, substrate 202 is comprised of a III-V material and the charge carrier dopant impurity atoms implanted to form source/drain regions 212 are selected from the group consisting of carbon, silicon, germanium, oxygen, sulfur, selenium or tellurium. Subsequent or alternative to the formation of source/drain regions 212, raised source/drain regions which strain channel region 218 may be formed and/or a silicide process may be carried out; these process steps are known in the art.

FIG. 2C represents a cross-sectional view down the b-b' projection of the structure illustrated in FIG. 2A. Gate electrode placeholder 206, gate isolation spacer 208, inter-layer dielectric layer 214 and optional PIN junction 260 from FIG. 2A and gate dielectric layer 204 and channel region 218 From FIG. 2B are all depicted in FIG. 2C in their cross-sectional form. A well isolation region 216 may be formed in substrate 202 and below optional PIN junction 260, as depicted in FIG. 2C. Well isolation region 216 may be formed from any material suitable to electrically isolate two semi-conducting regions of opposite conductivity type. In accordance with an embodiment of the present invention, well isolation region 216 is comprised of silicon dioxide, silicon oxy-nitride, carbon-doped silicon oxide, silicon nitride, carbon-doped silicon nitride or a combination thereof. In one embodiment, well isolation region 216 is formed by a shallow-trench isolation process.

Figure 3A:
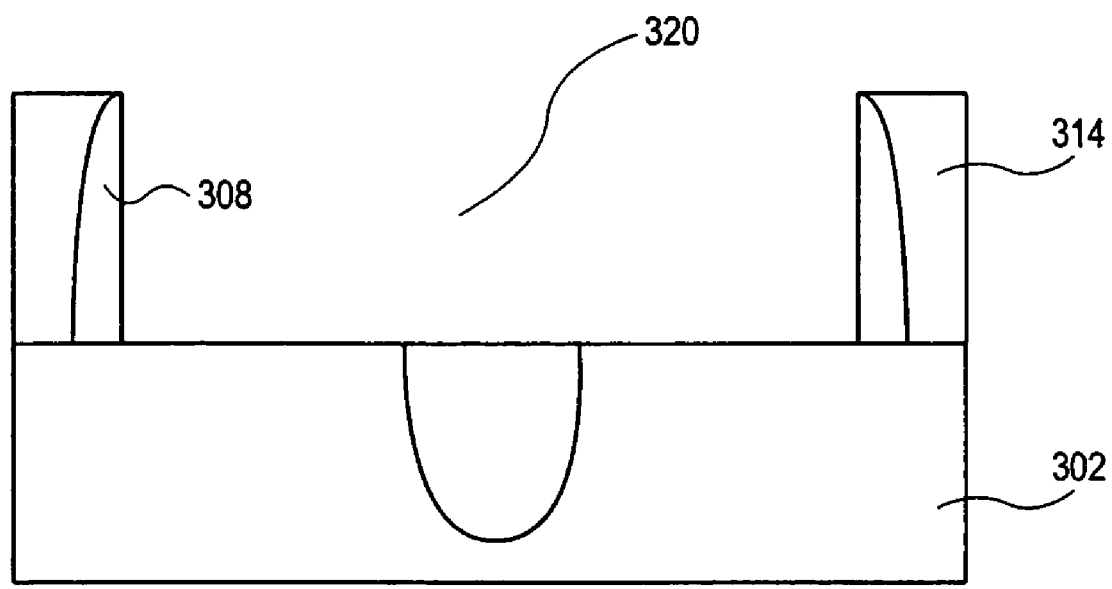
FIGS. 3A-B illustrate cross-sectional views representing a planar MOS-FET device at various stages of a replacement gate process, in accordance with an embodiment of the present invention.
Figure 3B:
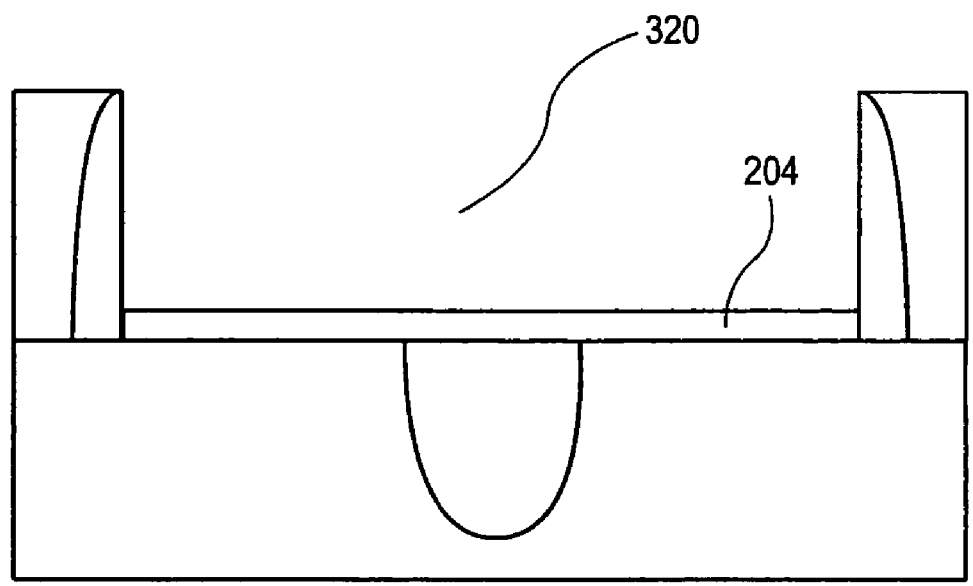

The structure depicted in FIGS. 2A-2C may be used in a replacement gate process scheme. FIGS. 3A-B illustrate cross-sectional views, down the b-b' projection from FIG. 2C, representing a planar MOS-FET device at various stages of a replacement gate process, in accordance with an embodiment of the present invention.

Referring to FIGS. 3A-B, a gate electrode placeholder (206 from FIGS. 2A-C) may be removed by any suitable technique that does not significantly impact inter-layer dielectric layer 204 or gate isolation spacers 208. In accordance with an embodiment of the present invention, a gate electrode placeholder is removed by a dry etch or wet etch process. In one embodiment, a gate electrode placeholder is comprised of polycrystalline silicon or amorphous silicon and is removed with a dry etch process comprising $SF_6$. In another embodiment, a gate electrode placeholder is comprised of polycrystalline silicon or amorphous silicon and is removed with a wet etch process comprising aqueous $NH_4OH$ or tetramethylammonium hydroxide. In an embodiment, a gate electrode placeholder is comprised of silicon dioxide and is removed with a wet etch process comprising aqueous hydrofluoric acid, ammonium fluoride or both. In one embodiment, a gate electrode placeholder is comprised of silicon nitride and is removed with a wet etch process comprising aqueous phosphoric acid. In another embodiment, a gate electrode placeholder comprises a metal layer that is removed with a Piranha ($H_2SO_4/H_2O_2/H_2O$) wet etch process. The removal of a gate electrode placeholder may form a trench 320, as depicted in FIGS. 3A-B. In accordance with an embodiment of the present invention, the narrowest length and/or width of trench 320 is less than 32 nanometers.

Referring to FIG. 3A, a gate dielectric layer placeholder (204 from FIGS. 2B-C) may be removed by any suitable technique that does not significantly impact inter-layer dielectric layer 314, gate isolation spacers 308 or substrate 302. In accordance with an embodiment of the present invention, a gate dielectric layer placeholder is removed by a dry etch or wet etch process. In one embodiment, a gate dielectric layer placeholder is comprised of silicon dioxide or silicon oxy-nitride and is removed with a wet etch comprising aqueous hydrofluoric acid, ammonium fluoride or both. In another embodiment, a gate dielectric layer placeholder is comprised of a high-k dielectric layer and is removed with a wet etch comprising aqueous phosphoric acid. In one embodiment, a gate electrode placeholder is removed in the same step as the removal of a gate dielectric layer placeholder. In another embodiment, gate dielectric layer 204 from FIGS. 2B-C is not removed, as depicted in FIG. 3B.

The structures from FIGS. 3A-B may provide a framework for a replacement gate process that utilizes a highly selective metal wet etchant with an active ingredient comprising one or more types of molecules having two or more oxygen atoms. For illustrative purposes, the structure in FIG. 3A, wherein a sacrificial gate dielectric layer has been removed, is used as the framework for the following embodiment of the present invention. In another embodiment, gate dielectric layer 302 from FIG. 3B is retained and a replacement gate dielectric layer may or may not be formed. FIGS. 4A-G illustrate cross-sectional views representing the formation of a patterned metal gate electrode in a MOS-FET device with a highly-selective metal etchant as utilized in a replacement gate process, in accordance with an embodiment of the present invention.

Figure 4A:
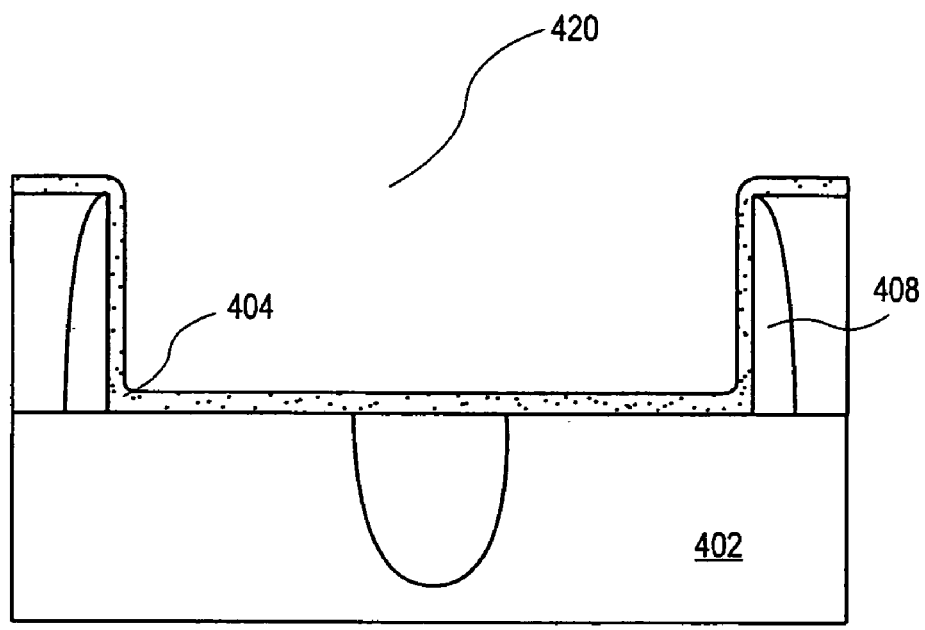
FIGS. 4A-G illustrate cross-sectional views representing the formation of a patterned metal gate electrode in a MOS-FET device with a highly-selective metal etchant as utilized in a replacement gate process, in accordance with an embodiment of the present invention.

Referring to FIG. 4A, a replacement gate dielectric layer 404 may be formed above substrate 402. Substrate 402 may be one of the possible substrates described in conjunction with substrate 202 from FIGS. 2A-C. In accordance with an embodiment of the present invention, replacement gate dielectric layer 404 is formed with any material suitable to insulate a gate electrode from substrate 402. In one embodiment, replacement gate dielectric layer 404 is formed by a thermal oxidation process and is comprised of silicon dioxide or silicon oxy-nitride. In another embodiment, replacement gate dielectric layer 404 is formed by chemical vapor deposition or atomic layer deposition and is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof. In one embodiment, replacement gate dielectric layer 404 is deposited conformal with the top surface of substrate 402, with the sidewalls of gate isolation spacers 408 and within trench 420, as depicted in FIG. 4A.

Figure 4B:
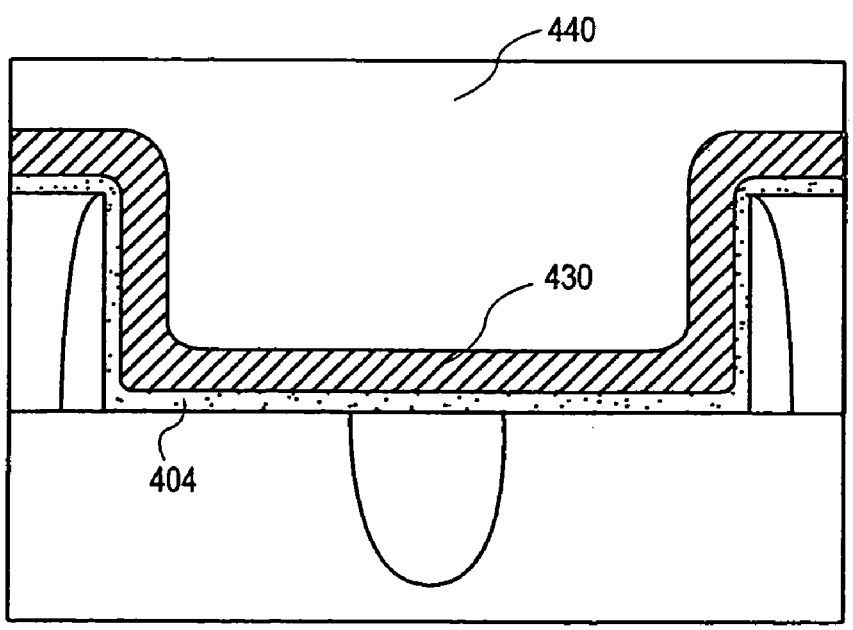

Referring to FIG. 4B, metal layer 430 may be formed above replacement gate dielectric layer 404. Metal layer 430 may be formed from any material with conductive properties and suitable for filling a region between gate isolation spacers 408. In one embodiment, metal layer 430 is comprised of a silicide of doped polycrystalline silicon. In another embodiment, metal layer 430 is comprised of a metal layer selected from the group consisting of a metal nitride, a metal carbide, hafnium, zirconium, titanium, tantalum, aluminum, ruthenium, palladium, platinum, cobalt, nickel, a conductive metal oxide or a combination thereof. In one embodiment, metal layer 430 has a thickness in the range of 15-200 Angstroms. In an embodiment of the present invention, metal layer 430 is deposited by a physical vapor deposition, chemical vapor deposition, atomic layer deposition, electroplating deposition or an electro-less plating deposition process. Metal layer 430 may have a workfunction appropriate for an N-type or a P-type transistor. In one embodiment, the workfunction of metal layer 430 is in the range of 3.9 eV-4.2 eV. In another embodiment, the workfunction of metal layer 430 is in the range of 4.9 eV-5.2 eV.

Referring again to FIG. 4B, masking layer 440 may be formed above metal layer 430. Masking layer 440 may be formed from any material suitable for undergoing a lithographic patterning process. In accordance with an embodiment of the present invention, masking layer 440 is comprised of a photo-resist and the photo-resist is in direct contact with metal layer 430. In one embodiment, the photo-resist is comprised of a material selected from the group consisting of polyhydroxy styrene resin or alicyclic polymers. In another embodiment, the photo-resist is comprised of a material selected from the group consisting of 248 nm or 193 nm photo-resists. In an alternative embodiment, masking layer 440 is also comprised of an antireflective coating, wherein the antireflective coating is comprised of a material selected from the group consisting of PGME or PGMEA. In another embodiment, masking layer 440 is also comprised of a sacrificial light-absorbing material (SLAM), such as but not limited to a spin-on glass material. In accordance with one embodiment of the present invention, masking layer 440 fills the remaining region of trench 420 above metal layer 430, as depicted in FIG. 4B.

Figure 4C:
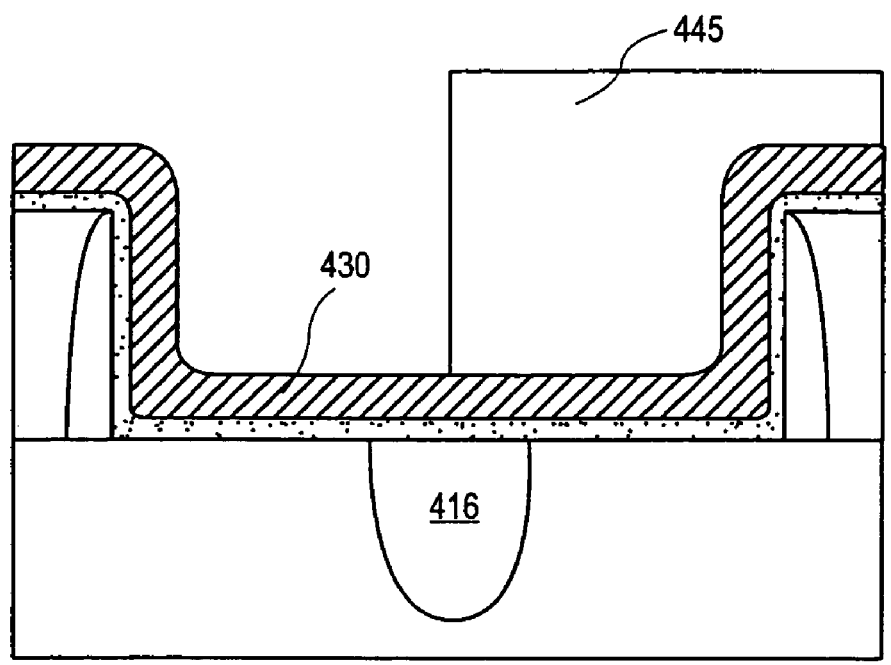

Referring to FIG. 4C, masking layer 440 may be patterned to form patterned masking layer 445 and to expose a portion of metal layer 430. Masking layer 440 may be patterned by any suitable method that provides the desired dimensions of the resulting MOS-FET device 400 from below. In one embodiment, masking layer 440 is patterned with a conventional lithography process, such as 248 nm or 193 nm lithography. In another embodiment, masking layer 440 is patterned with a non-conventional lithography process, such as immersion, EUV or X-ray lithography. In accordance with a an embodiment of the present invention, masking layer 440 is patterned to expose a portion of metal layer 430 on one side of isolation region 416, but not on the other side of isolation region 416, as depicted in FIG. 4C.

Figure 4D:
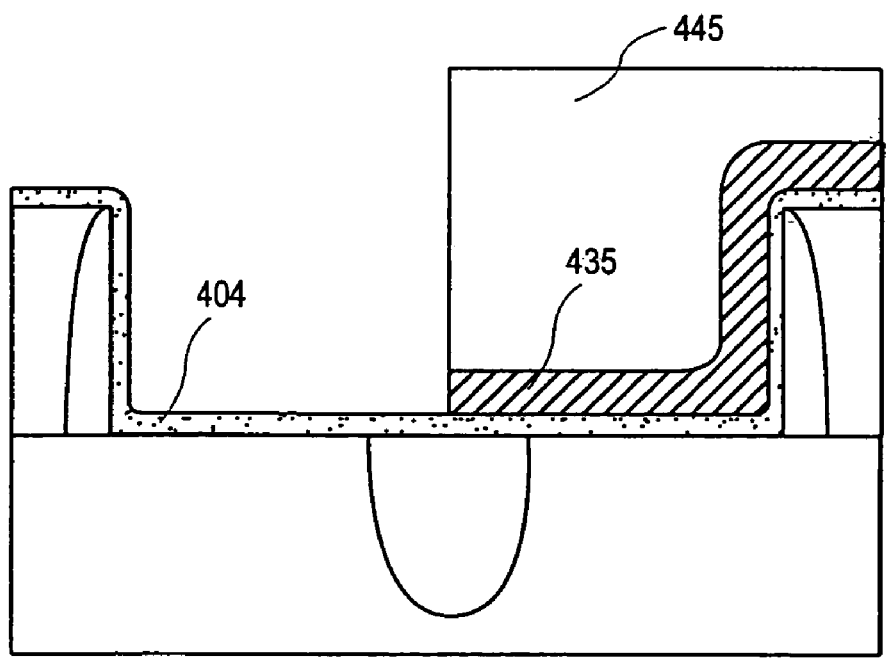

The exposed portion of metal layer 430, described in association with FIG. 4C, may be removed to form a gate electrode 435, as depicted in FIG. 4D. In one embodiment, the exposed portion of metal layer 430 is removed by using a wet etch solution with an active ingredient comprising one or more types of molecules having two or more oxygen atoms. In an embodiment, the active ingredient is selected from the group consisting of $H_2O_2$, an organic peroxide or a combination thereof. In another embodiment, the active ingredient is selected from the group consisting of ozone or a combination of ozone and $H_2O_2$. The ozone can be dissolved in the wet etchant to a desired concentration in the range of 0.5-5% by volume by bubbling gaseous ozone into the wet etchant media (e.g. into a mixture of water and hydrogen peroxide) at a temperature in the range of 10° C.-50° C. within about an hour prior to etching metal layer 430. Alternatively, a wet etch solution comprising ozone can be prepared in the manner described above and subsequently stored in a pressure vessel until required. In one embodiment, the wet etch solution is comprised of de-ionized water and a total concentration of the active ingredient (i.e. additive contribution of all etching molecules) in the range of 10%-20% by volume. In another embodiment, the wet etch solution has a temperature in the range of 24° C.-40° C. and a pH in the range of 5-8. The etch rate, i.e. the rate at which the exposed portion of metal layer 430 is removed, may be targeted to balance processing efficiency and minimization of undercut of the masking layer 440 (i.e. the undesirable removal of portions of metal layer 430 from underneath masking layer 440). In accordance with an embodiment of the present invention, the wet etch solution is comprised of de-ionized water and a concentration of the active ingredient in the range of 10%-20% by volume, has a temperature in the range of 24° C.-40° C., has a pH in the range of 5-8 and provides an etch rate in the range of 10-30 Angstroms/min.

Referring again to FIG. 4D, the exposed portion of metal layer 430 is removed with selectivity to replacement gate dielectric layer 404 and with selectivity to patterned masking layer 445. In accordance with an embodiment of the present invention, replacement gate dielectric layer 404 is comprised of a high-k dielectric layer and the selectivity for removing the exposed portion of metal layer 430 is at least 100:1 for metal layer 430 to replacement gate dielectric layer 404. In one embodiment, the active ingredient of the wet etch solution is ozone and the ozone dissociates to provide super-oxide radicals that absorb onto the surface of replacement gate dielectric layer 404. In accordance with another embodiment of the present invention, patterned masking layer 445 is comprised of a photo-resist and the selectivity for removing the exposed portion of metal layer 430 is at least 10:1 for metal layer 430 to patterned masking layer 445.

Figure 4E:
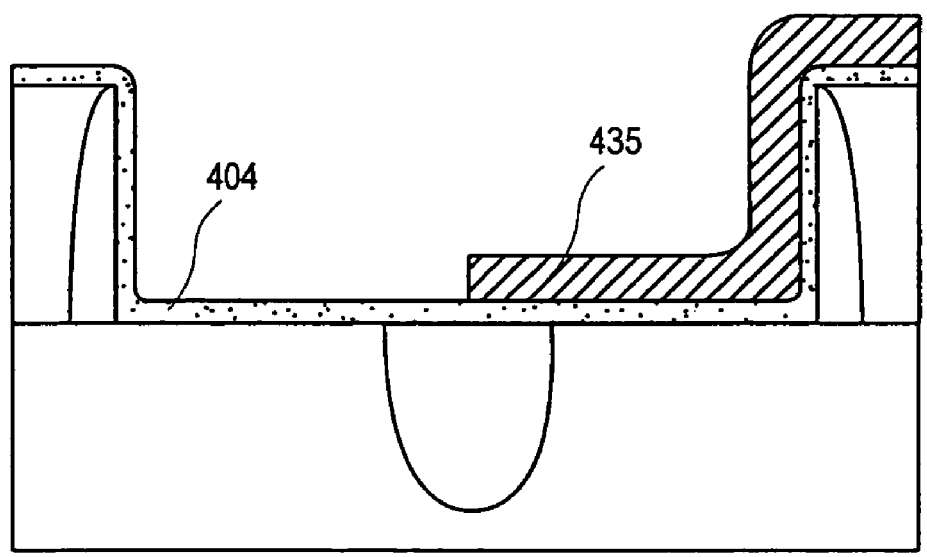

Referring to FIG. 4E, patterned masking layer 445 may be removed from the structure formed in FIG. 4D. Patterned masking layer 445 may be removed with any technique suitable for leaving behind no residue, or a negligible amount of residue, from masking layer 445 and suitable for not significantly impacting, e.g. eroding or modifying, gate electrode 435 or replacement dielectric layer 404. In one embodiment, patterned masking layer 445 is comprised of a photo-resist and is removed with an etchant selected from the group consisting of $NH_4OH$ or TMAH. In another embodiment, patterned masking layer is also comprised of an antireflective coating and is removed with an etchant selected from the group consisting of TMAH, $NH_4OH$, KOH or BTMAH.

Figure 4F:
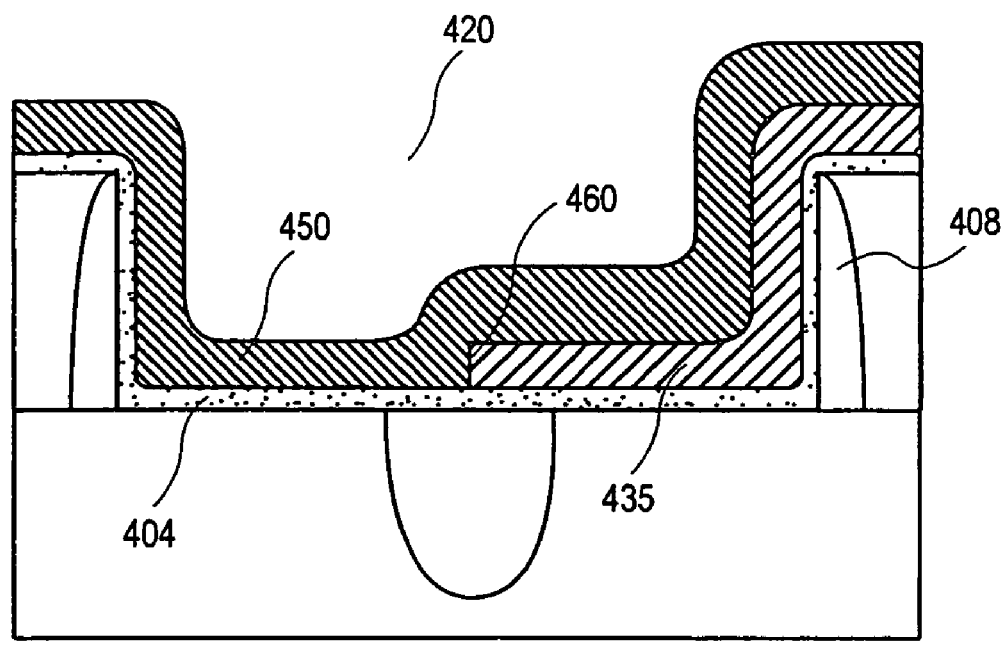

A second metal layer may be deposited above the structure formed in association with FIG. 4E. The metal layer may be formed from any material with conductive properties and suitable for filling a region between gate isolation spacers 408. In accordance with an embodiment of the present invention, metal layer 450 is deposited conformal with the exposed portion of gate dielectric layer 404 at the bottom of trench 420 and with gate electrode 435, as depicted in FIG. 4F. In one embodiment, metal layer 450 is comprised of a silicide of doped polycrystalline silicon. In another embodiment, metal layer 450 is comprised of a metal layer selected from the group consisting of a metal nitride, a metal carbide, hafnium, zirconium, titanium, tantalum, aluminum, ruthenium, palladium, platinum, cobalt, nickel, a conductive metal oxide or a combination thereof. In one embodiment, metal layer 450 has a thickness in the range of 15-20 Angstroms. In an embodiment of the present invention, metal layer 450 is deposited by a physical vapor deposition, chemical vapor deposition, atomic layer deposition, electroplating deposition or an electro-less plating deposition process.

Metal layer 450 may act as a second gate electrode. In accordance with an embodiment of the present invention, metal layer 450 has a workfunction appropriate for an N-type or a P-type transistor. In one embodiment, the workfunction of metal layer 430 is in the range of 3.9 eV-4.2 eV. In another embodiment, the workfunction of metal layer 430 is in the range of 4.9 eV-5.2 eV. In one embodiment, a P/N junction 460 is formed at the vertical interface between gate electrode 435 and metal layer 450 and over isolation region 416.

Figure 4G:
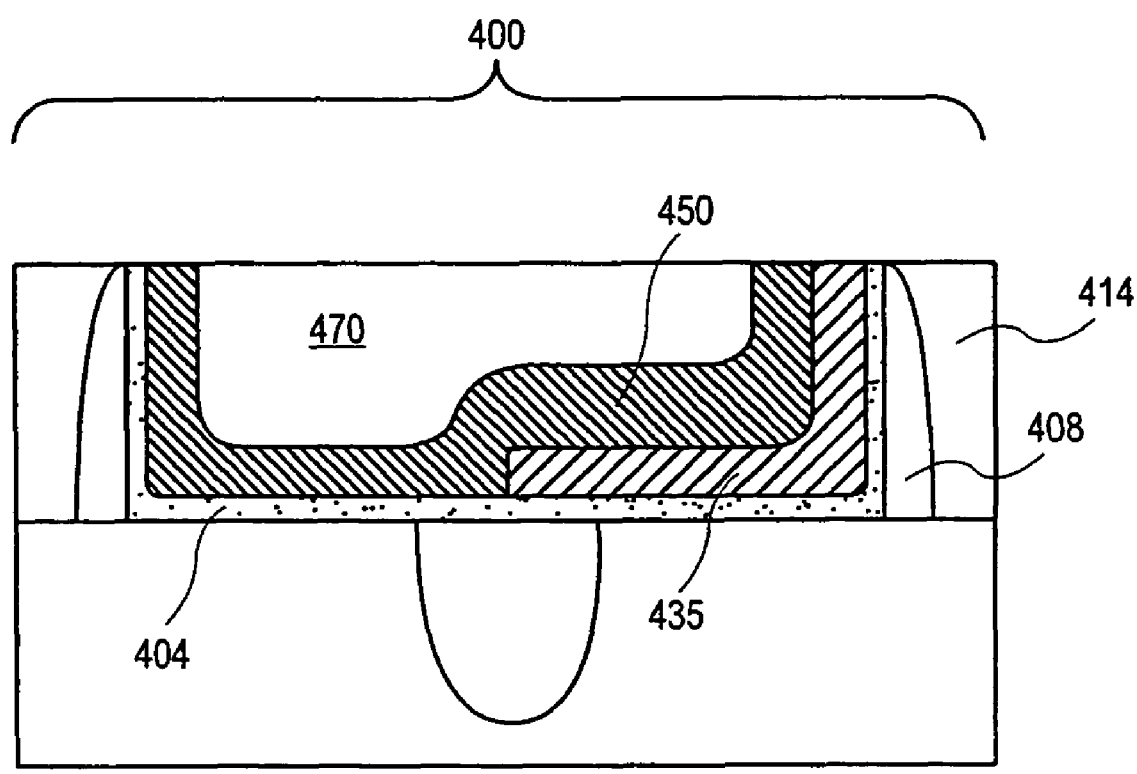

Referring to FIG. 4G, a fill metal 470 may be deposited to fill any remaining open regions of trench 420 above metal layer 450 to form MOS-FET 400. Fill metal 470 may be comprised of any material suitable for providing a low resistance interface with a contact structure used to incorporate MOS-FET 400 into an integrated circuit. In one embodiment, fill metal 470 is comprised of copper, silver, aluminum, tungsten, titanium nitride, tantalum nitride or a combination thereof. In an embodiment of the present invention, fill metal 470 is deposited by a physical vapor deposition, chemical vapor deposition, atomic layer deposition, electroplating deposition or an electro-less plating deposition process. In accordance with an embodiment of the present invention, a chemical-mechanical process step follows the deposition of fill metal 470. In one embodiment, the chemical-mechanical process step removes any material, e.g. from replacement gate dielectric layer 404, from gate electrode 435, from metal layer 450 or from fill metal 470, that remains above interlayer dielectric layer 414 or above gate isolation spacers 408. In an embodiment a planar surface is provided, as depicted in FIG. 4G. Thus, referring to FIG. 4G, a planar MOS-FET 400 comprising a metal layer patterned with a highly selective metal wet etchant with an active ingredient comprising one or more types of molecules having two or more oxygen atoms may be formed. Planar MOS-FET 400 may subsequently be incorporated into an integrated circuit by conventional process steps, as known in the art.

Therefore, a highly selective metal wet etchant may be utilized to pattern a metal layer in a semiconductor structure. In one embodiment, a highly selective metal wet etchant with an active ingredient comprising one or more types of molecules having two or more oxygen atoms is used to pattern a metal gate electrode in a replacement gate processing scheme.

What is claimed is:

1. A method for making a semiconductor structure comprising:
   forming a dielectric layer above a substrate;
   forming a metal layer above said dielectric layer;
   forming a masking layer above said metal layer, wherein said masking layer is comprised of a photo-resist;
   patterning said masking layer to provide a patterned masking layer and an exposed portion of said metal layer; and
   removing, in the presence of said patterned masking layer, said exposed portion of said metal layer with a wet etch solution, wherein said wet etch solution is comprised of an active ingredient comprising one or more types of molecules having two or more oxygen atoms, wherein said exposed portion of said metal layer is removed with a first selectivity to said photo-resist, and wherein said exposed portion of said metal layer is removed with a second selectivity to said dielectric layer.

2. The method of claim 1 wherein said masking layer is also comprised of an antireflective coating, and wherein said antireflective coating is comprised of a material selected from the group consisting of PGME or PGMEA.

3. The method of claim 1 wherein said wet etch solution is comprised of de-ionized water and a concentration of said active ingredient in the range of 10% 20% by volume, wherein said wet etch solution has a temperature in the range of 24° C.-40° C., and wherein said wet etch solution has a pH in the range of 5-8.

4. The method of claim 3 wherein said active ingredient is selected from the group consisting of $H_2O_2$, an organic peroxide or a combination thereof.

5. The method of claim 3 wherein said active ingredient is selected from the group consisting of ozone or a combination of ozone and $H_2O_2$.

6. The method of claim 1 wherein said dielectric layer is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof, and wherein said second selectivity is at least 100:1 for said metal layer to said dielectric layer.

7. The method of claim 6 wherein said metal layer is selected from the group consisting of a metal nitride, a metal carbide, hafnium, zirconium, titanium, tantalum, aluminum, ruthenium, palladium, platinum, cobalt, nickel, a conductive metal oxide or a combination thereof.

8. The method of claim 6 wherein said photo-resist is comprised of a material selected from the group consisting of polyhydroxy styrene resin or alicyclic polymers.

9. The method of claim 8 wherein said first selectivity is at least 10:1 for said metal layer to said photo-resist.

10. The method of claim 6 wherein said active ingredient is ozone, and wherein the ozone dissociates to provide superoxide radicals that absorb onto the surface of said high-k dielectric layer.

11. A method for making a semiconductor structure comprising:
    forming a first dielectric layer above a substrate;
    forming a trench in said first dielectric layer to provide an exposed portion of said substrate;
    forming a second dielectric layer above said exposed portion of said substrate;
    forming a metal layer above said second dielectric layer;
    forming a masking layer above said metal layer, wherein said masking layer is comprised of a photo-resist;
    patterning said masking layer to provide an exposed portion of said metal layer within said trench and to provide a covered portion of said metal layer within said trench; and
    removing said exposed portion of said metal layer within said trench with a wet etch solution, wherein said wet etch solution is comprised of an active ingredient comprising one or more types of molecules having two or more oxygen atoms, wherein said exposed portion of said metal layer within said trench is removed with a first selectivity to said photo-resist, and wherein said exposed portion of said metal layer within said trench is removed with a second selectivity to said second dielectric layer.

12. The method of claim 11 wherein said masking layer is also comprised of an antireflective coating, and wherein said antireflective coating is comprised of a material selected from the group consisting of PGME or PGMEA.

13. The method of claim 11 wherein said wet etch solution is comprised of de-ionized water and a concentration of said active ingredient in the range of 10%-20% by volume, wherein said wet etch solution has a temperature in the range of 24° C.-40° C., and wherein said wet etch solution has a pH in the range of 5-8.

14. The method of claim 13 wherein said active ingredient is selected from the group consisting of $H_2O_2$, an organic peroxide or a combination thereof.

15. The method of claim 13 wherein said active ingredient is selected from the group consisting of ozone or a combination of ozone and $H_2O_2$.

16. The method of claim 11 wherein said second dielectric layer is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof, and wherein said second selectivity is at least 100:1 for said metal layer to said second dielectric layer.

17. The method of claim 16 wherein said trench has a narrowest width, and wherein the narrowest width of said trench is less than 32 nanometers.

18. The method of claim 16 wherein said photo-resist is comprised of a material selected from the group consisting of polyhydroxy styrene resin or alicyclic polymers.

19. The method of claim 18 wherein said first selectivity is at least 10:1 for said metal layer to said photo-resist.

20. The method of claim 16 wherein said active ingredient is ozone, and wherein the ozone dissociates to provide superoxide radicals that absorb onto the surface of said high-k dielectric layer.

21. A method for making a semiconductor device comprising:
    forming a gate placeholder structure above a substrate;
    forming source/drain regions in said substrate and on either side of said gate placeholder;
    forming a dielectric layer above said substrate and above said gate placeholder structure;
    planarizing said dielectric layer to expose the top surface of said gate placeholder structure;
    removing said gate placeholder structure to provide a trench in said dielectric layer and to provide an exposed portion of said substrate within said trench;
    forming a gate dielectric layer above said exposed portion of said substrate within said trench;
    forming a first metal gate electrode above said gate dielectric layer;
    forming a masking layer above said first metal gate electrode, wherein said masking layer is comprised of a photo-resist;
    patterning said masking layer to provide an exposed portion of said first metal gate electrode within said trench and to provide a covered portion of said first metal gate electrode within said trench; and
    removing said exposed portion of said first metal gate electrode within said trench with a wet etch solution to provide an exposed portion of said gate dielectric layer within said trench, wherein said wet etch solution is comprised of an active ingredient comprising one or more types of molecules having two or more oxygen atoms, wherein said exposed portion of said first metal gate electrode within said trench is removed with a first selectivity to said photo-resist, and wherein said exposed portion of said first metal gate electrode within said trench is removed with a second selectivity to said gate dielectric layer;
    removing said masking layer; and
    forming a second metal gate electrode within said trench, wherein said second metal gate electrode is above said first metal gate electrode and above said exposed portion of said gate dielectric layer within said trench.

22. The method of claim 21 wherein said masking layer is also comprised of an antireflective coating, and wherein said antireflective coating is comprised of a material selected from the group consisting of PGME or PGMEA.

23. The method of claim 21 wherein said wet etch solution is comprised of de-ionized water and a concentration of said active ingredient in the range of 10%-20% by volume, wherein said wet etch solution has a temperature in the range of 24° C.-40° C., and wherein said wet etch solution has a pH in the range of 5-8.

24. The method of claim 23 wherein said active ingredient is selected from the group consisting of $H_2O_2$, an organic peroxide or a combination thereof.

25. The method of claim 23 wherein said active ingredient is selected from the group consisting of ozone or a combination of ozone and $H_2O_2$.

26. The method of claim 21 wherein said gate dielectric layer is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof, and wherein said second selectivity is at least 100:1 for said first metal gate electrode to said gate dielectric layer.

27. The method of claim 26 wherein the narrowest width of said trench is less than 32 nanometers.

28. The method of claim 26 wherein said photo-resist is comprised of a material selected from the group consisting of polyhydroxy styrene resin or alicyclic polymers.

29. The method of claim 28 wherein said first selectivity is at least 10:1 for said first metal gate electrode to said photo-resist.

30. The method of claim 26 wherein said active ingredient is ozone, and wherein the ozone dissociates to provide superoxide radicals that absorb onto the surface of said high-k dielectric layer.

* * * * *